(12) United States Patent
Nikitin et al.

(10) Patent No.: US 7,039,855 B2
(45) Date of Patent: May 2, 2006

(54) DECISION FUNCTION GENERATOR FOR A VITERBI DECODER

(75) Inventors: Andrey A. Nikitin, Moscow (RU); Alexander E. Andreev, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 534 days.

(21) Appl. No.: 10/349,664

(22) Filed: Jan. 22, 2003

(65) Prior Publication Data

US 2004/0153955 A1    Aug. 5, 2004

(51) Int. Cl.
*H04L 27/22*    (2006.01)

(52) U.S. Cl. ............... 714/795; 714/709; 714/790; 714/794; 375/262; 375/265; 375/341

(58) Field of Classification Search ........... 714/709; 375/329, 262
See application file for complete search history.

(56) References Cited

U.S. PATENT DOCUMENTS

| | | | | |
|---|---|---|---|---|
| 5,687,164 A | * | 11/1997 | Takahashi et al. | 370/207 |
| 6,041,432 A | * | 3/2000 | Ikeda | 714/786 |
| 6,115,435 A | * | 9/2000 | Harada et al. | 375/341 |
| 6,289,487 B1 | | 9/2001 | Hessel et al. | |
| 6,370,201 B1 | | 4/2002 | Abbaszadeh et al. | |
| 6,374,387 B1 | | 4/2002 | van den Berghe | |
| 6,421,400 B1 | | 7/2002 | Rhee et al. | |
| 2003/0235261 A1 | * | 12/2003 | Patana | 375/376 |
| 2004/0025107 A1 | * | 2/2004 | Hessel | 714/796 |
| 2004/0258173 A1 | * | 12/2004 | Wang | 375/262 |

FOREIGN PATENT DOCUMENTS

JP    11027156 A    *    1/1999

OTHER PUBLICATIONS

Biglieri; "Digital Modulation Techniques"; Basic Principles; *IEEE Transactions on Communications*; CRC Press, Inc.; 1997; pp. 273-287.

* cited by examiner

*Primary Examiner*—R. Stephen Dildine
(74) *Attorney, Agent, or Firm*—Fitch, Even, Tabin & Flannery

(57) ABSTRACT

A decision function generator for a Viterbi decoder includes a compressor module for receiving arguments of a decision function and for evaluating functions of the arguments of the decision function, a memory module coupled to the compressor module for generating an intermediate function from the functions of the arguments, and a decompressor module coupled to the memory module for generating a sign value, an integer value, and a fractional value constituting a value of the decision function from the intermediate function.

18 Claims, 4 Drawing Sheets

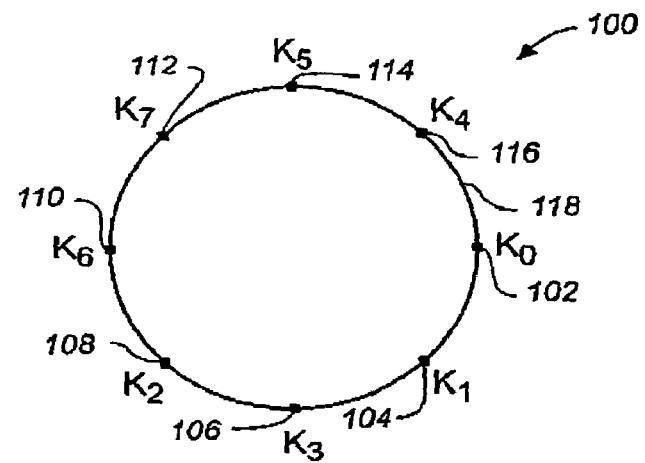
FIG._1
(PRIOR ART)
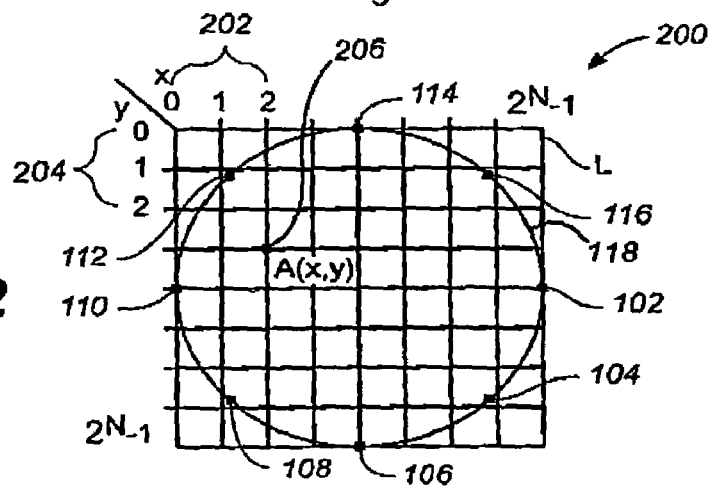
FIG._2
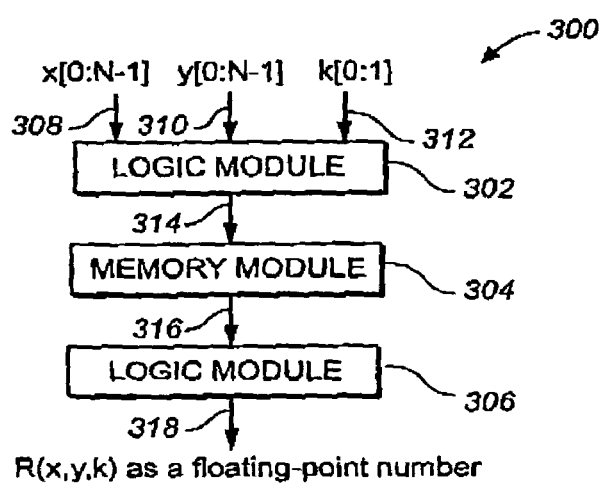
FIG._3

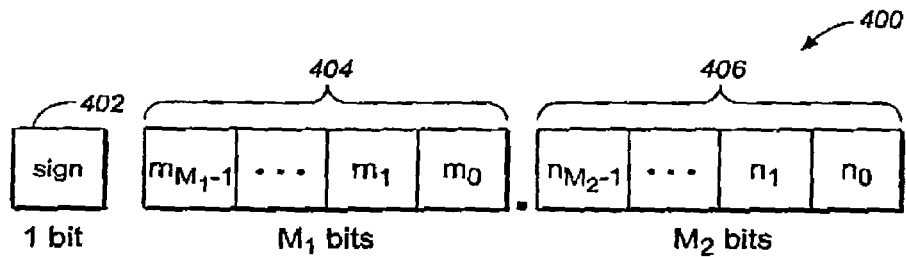
FIG._4
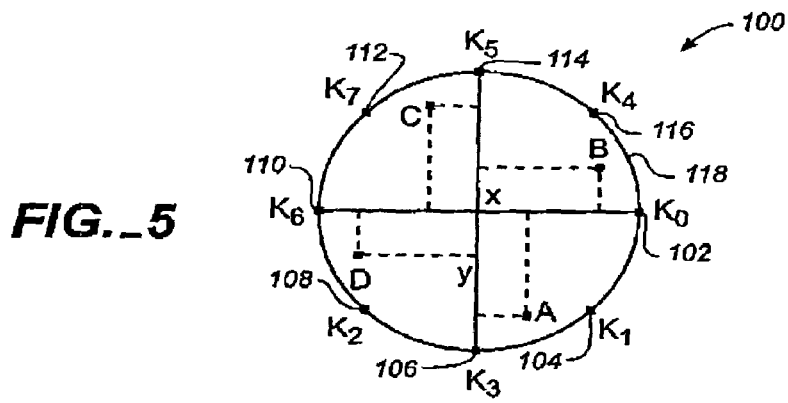
FIG._5
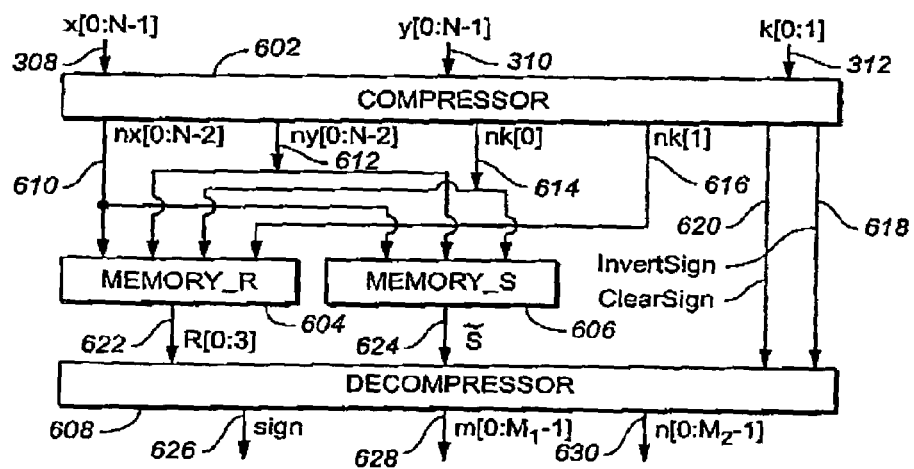
FIG._6

```
module COMPRESSOR(x, y, k, nx, ny, nk, ClearSign, InvertSign)
{
    input [0:N-1] x;
    input [0:N-1] y;
    input [0:1] k;
    output [0:N-2] nx;
    output [0:N-2] ny;
    output [0:1] nk;
    output ClearSign;
    output InvertSign;

wire sum_k;
    wire [0:N-1] sum_xy;
    wire exchange_k;
    wire [0:N-2] exchange_xy;

sum_k = XOR(k[0], k[1]);
    for (i=0;i<N;i++)
        sum_xy[i] = XOR(x[i],y[i]);
    exchange_k = AND(sum_k, sum_xy[N-1]);
    for (i=0;i<(N-1);i++)
        exchange_xy[i] = AND(sum_xy[i], sum_xy[N-1]);

for (i=0;i<(N-1);i++) {
        nx[i] = XOR(exchange_xy[i], XNOR(x[i], y[N-1]));
        nx[i] = XOR(exchange_xy[i], XNOR(x[i], x[N-1]));
    }
    for (i=0;i<2;i++)
        nk[i] = XOR(k[i], exchange_k);
    ClearSign = nk[1];
    InvertSign = XOR(OR(k[0], y[N-1]), OR(k[1], x[N-1]));
}
```

*FIG. 7*

```
module DECOMPRESSOR (R, S, InvertSign, ClearSign)
{
    input [0:3] R;
    input S;
    input InvertSign;
    input ClearSign;
    output sign;
    output [0:M1-1] m;
    output [0:M2-1] n;
    sign = XOR(AND01(ClearSign, S), InvertSign);
    for (i=3;i<M1;i++)
        m[i] = 0;
    m[2] = AND01(R[3], R[2]);
    m[1] = AND01(R[3], OR01(R[2], R[1]));
    m[0] = OR(AND01(R[3], R[0]), AND01(R[2], R[3]));
    for (i=0;i<(M2-2);i++)
        n[i] = 0;
    n[M2-2] = AND(R[0], R[3]);
    n[M2-1] = AND01(m[2], R[1]);
}
```
FIG._8
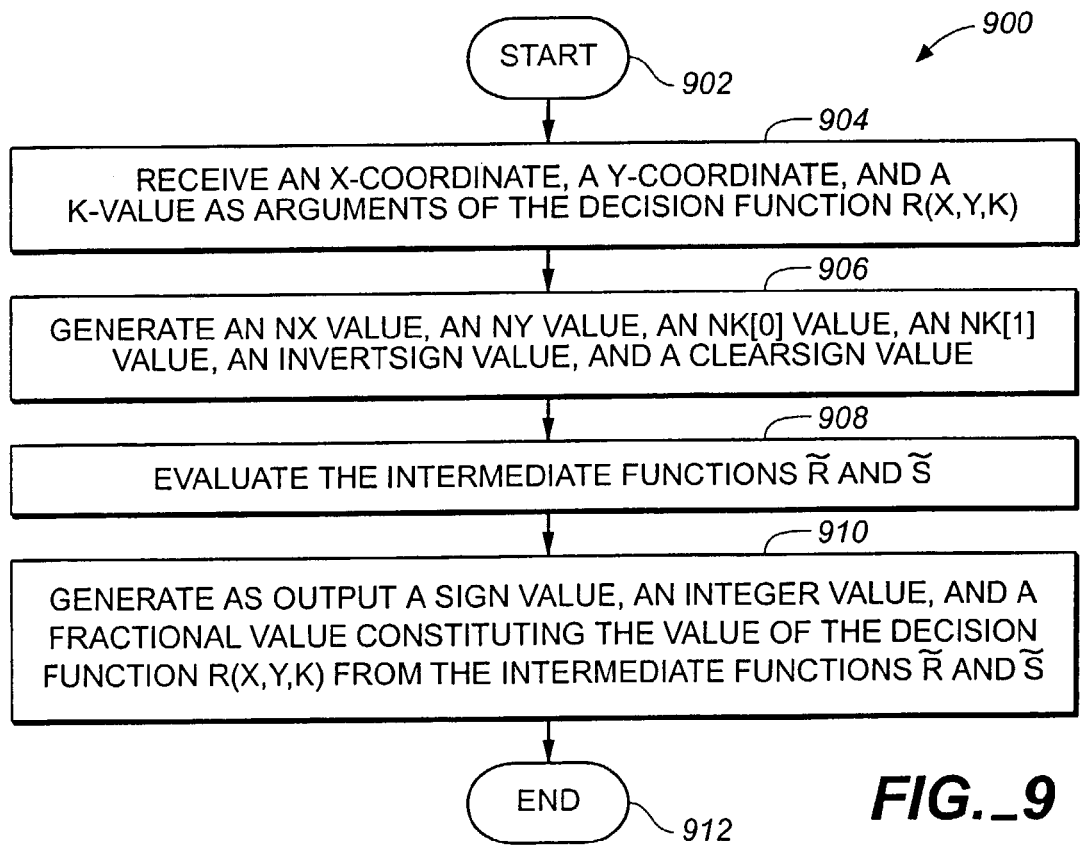
FIG._9

DECISION FUNCTION GENERATOR FOR A VITERBI DECODER

BACKGROUND OF THE INVENTION

1. Field of the Invention

The present invention is directed to methods of decoding phase shift keyed (PSK) communications signals. More specifically, but without limitation thereto, the present invention is directed to a method of calculating an error probability of a received 8-phase shift keyed code.

2. Description of the Prior Art

Phase shift keyed signals (PSK) are often used in systems for communicating data over a distance. A phase shift keyed signal consists of a carrier that is modulated in phase increments, for example, 90 degree increments in quadrature, or 4-PSK, 45 degree increments in 8-PSK, and 22.5 degree increments in 16-PSK. Each phase increment corresponds to a code symbol in the phase shift keyed signal. A complete set of code symbols for modulating a phase shift keyed signal is called a trellis modulation code (TCM). A PSK communications system transmitter typically includes a source of the carrier signal and a PSK modulator responsive to an input binary signal for modulating the carrier signal. The PSK communications system receiver typically includes a phase demodulator, or decoder, suitable for extracting instantaneous phase shift information from the carrier signal and recovering the data represented by the phase shift information. A suitable decoder for demodulating the phase modulation is a Viterbi decoder, in which the accuracy of the demodulation is dependent on the electrical noise that may be received along with the modulated carrier signal.

SUMMARY OF THE INVENTION

In one aspect of the present invention, a decision function generator for a Viterbi decoder includes a compressor module for receiving arguments of a decision function and for evaluating functions of the arguments of the decision function, a memory module coupled to the compressor module for generating an intermediate function from the functions of the arguments, and a decompressor module coupled to the memory module for generating a sign value, an integer value, and a fractional value constituting a value of the decision function from the intermediate function.

In another aspect of the present invention, a method of generating a decision function for a Viterbi decoder includes steps for receiving arguments of a decision function, generating functions of the arguments of the decision function, evaluating an intermediate function from the functions of each of the arguments, and generating as output a sign value, an integer value, and a fractional value constituting a value of the decision function from the intermediate function.

DESCRIPTION OF THE DRAWINGS

The present invention is illustrated by way of example and not limitation in the accompanying figures, in which like references indicate similar elements throughout the several views of the drawings, and in which:

FIG. 1 illustrates an 8-PSK geometrically uniform trellis modulation code of the prior art;

FIG. 2 illustrates the construction of a lattice superimposed on the trellis modulation code of FIG. 1;

FIG. 3 illustrates a decision function generator for a Viterbi decoder according an embodiment of the present invention;

FIG. 4 illustrates a binary representation of a floating point number for the decision function generator of FIG. 3;

FIG. 5 illustrates the 8-PSK geometrically uniform trellis modulation code of FIG. 1 with the coordinates of four symmetrically spaced demodulated code points;

FIG. 6 illustrates a detailed block diagram of the decision function generator of FIG. 3; and FIG. 7 illustrates an implementation of the compressor module of FIG. 6 in pseudo-Verilog language;

FIG. 8 illustrates an implementation of the decompressor module of FIG. 6 in pseudo-Verilog language; and FIG. 9 illustrates a flow chart for a method of generating a decision function for a Viterbi decoder according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

DESCRIPTION OF THE ILLUSTRATED EMBODIMENTS

FIG. 1 illustrates an 8-PSK geometrically uniform trellis modulation code 100 of the prior art. Shown in FIG. 1 are code points 102, 104, 106, 108, 110, 112, 114 and 116 and a phase circle 118. Each of the code points 102–116 is mapped to a corresponding modulation phase on the phase circle 104. In this example, the code point 102 is mapped to 0 degrees phase on the phase circle 104, the code point 104 is mapped to 45 degrees phase on the phase circle 104, the code point 106 is mapped to 90 degrees phase on the phase circle 104, and so on. The radius of the phase circle 104 corresponds to the normalized amplitude of the transmitted PSK signal. Each of the code points 102–116 has an associated binary symbol code 000, 001, 010, . . . , 111. Each code point received and decoded by a Viterbi decoder would have precisely the phase and amplitude of one of the code points 102–116 if no electrical noise were present in the transmitted signal. In practice, however, electrical noise interferes with the transmitted signal to some extent, and the code point decoded by the Viterbi decoder has a phase and amplitude somewhere inside the phase circle 104. A coordinate grid or lattice may be superimposed on the trellis modulation code 100 to identify locations inside the phase circle 104 as follows.

FIG. 2 illustrates the construction of a lattice 200 L superimposed on the trellis modulation code of FIG. 1. Shown in FIG. 2 are the code points 102, 104, 106, 108, 110, 112, 114 and 116, the phase circle 118, x-coordinates 202, y-coordinates 204, and a demodulated code point 206. The demodulated code point 206 is represented as A(x,y), where x is one of the x-coordinates 202, and y is one of the y-coordinates 204. The lattice 200 L has a resolution of $2^N \times 2^N$ points, where $2^N$ is the resolution of the lattice L.

For each demodulated code point 206 A(x,y) of the lattice 200 and for each code point 102–116 represented by $K_i$ $(x_i, y_i)$, where i is the binary value 000, 001, . . . , 111 of the code point 206 $K_i$, a probability function $P(x,y,x_i,y_i)$ is defined to be the probability that A(x,y) is an image of $K_i(x_i,y_i)$ after being distorted by a noise signal. The probability function $P(x,y,x_i,y_i)$ is a function $P_0$ of the Euclidean distance metric:

$$E(x,y,x_i,y_i)=(x-x_i)^2+(y-y_i)^2=z_i \quad (1)$$

where $$P_0(z_1) < P_0(z_2) \text{ for } z_1 \geq z_2 \geq 0 \quad (2)$$

so that $$P(x,y,x_i,y_i)=P_0(z_i) \quad (3)$$

The following functions are defined from the probability function $P(x,y,x_i,y_i)$:

$$P^i = P(x,y,x_i,y_i)(x,y) \in L, i=0,\ldots,7 \quad (4)$$

$$R_0(x,y) = \ln\left(\frac{P^0(x,y)+P^2(x,y)+P^4(x,y)+P^6(x,y)}{P^1(x,y)+P^3(x,y)+P^5(x,y)+P^7(x,y)}\right) \quad (5)$$

$$R_1(x,y) = \ln\left(\frac{P^0(x,y)+P^1(x,y)+P^4(x,y)+P^5(x,y)}{P^2(x,y)+P^3(x,y)+P^6(x,y)+P^7(x,y)}\right) \quad (6)$$

$$R_2(x,y) = \ln\left(\frac{P^0(x,y)+P^1(x,y)+P^2(x,y)+P^3(x,y)}{P^4(x,y)+P^5(x,y)+P^6(x,y)+P^7(x,y)}\right) \quad (7)$$

$$R(x,y,k) = \begin{cases} R_0(x,y) & \text{if } k=0 \\ R_1(x,y) & \text{if } k=1 \\ R_2(x,y) & \text{if } k=2 \end{cases} \quad (x,y)\in L, k=0,1,2 \quad (8)$$

The function R(x,y,k) is used in several algorithms for determining symbols decoded from 8-PSK code. Examples of methods of simple distance metric evaluation are described in U.S. Pat. No. 6,421,400, issued on Jul. 16, 2002 to Rhee et al., and U.S. Pat. No. 6,370,201, issued on Apr. 9, 2002 to Abbaszadeh et al., both incorporated herein by reference. Descriptions of various components of the software and hardware decoding systems are described in U.S. Pat. No. 6,374,387, issued on Apr. 16, 2002 to van den Berghe, and U.S. Pat. No. 6,289,487, issued on Sep. 11, 2001 to Hessel et al., both incorporated herein by reference.

The 3-bit binary symbol 000, 001, . . . , 111 for each code point $K_i$ may be represented as the set $(i_0, i_1, i_2)$, where the symbol value is equal to $i_0+2*i_1+4*i_2$. For example, the symbol 110 may be represented by the set (0, 1, 1), which has the value 0+2*1+4*1=6. The numerator of the fraction in each of the formulas (5), (6) and (7) is the sum of the probabilities $p^i(x,y)$ that correspond to the code points $K_i$ for which $i_0$ in formula (5), $i_1$ in formula (6), and $i_2$ in formula (7) are equal to zero. For example, in formula (5), the code points $K_i$ for which $i_0=0$ are 0, 2, 4 and 6. In formula (6), the code points $K_i$ for which $i_1=0$ are 0, 1, 4 and 5. In formula (7), the code points $K_i$ for which $i_2=0$ are 0, 1, 2 and 3. The denominator of the fraction in each of the formulas (5), (6) and (7) is the sum of the probabilities $p^i(x,y)$ that correspond to the code points $K_i$ for which $i_0$ in formula (5), $i_1$ in formula (6), and $i_2$ in formula (7) are equal to one. For example, in formula (5), the code points $K_i$ for which $i_0=1$ are 1, 3, 5 and 7. In formula (6), the code points $K_i$ for which $i_1=1$ are 2, 3, 6 and 7. In formula (7), the code points $K_i$ for which $i_2=1$ are 4, 5, 6 and 7.

Assuming that all of the code points $K_i$ have an identical probability, the function R(x,y,k) may be expressed as:

$$R(x,y,k) = \ln\left(\frac{P(i_k=0|(x,y))}{P(i_k=1|(x,y))}\right), (x,y)\in L, k=0,1,2 \quad (9)$$

where $P(i_k=0|(x,y))$ or $P(i_k=1|(x,y))$ is the probability that the demodulated code point 206 A(x,y) is the distorted image of the code points $K_i$ represented by the set $(i_0, i_1, i_2)$ for which $i_k=0$ or 1, respectively. The function R(x,y,k) may thus be used as part or all of a decision function for an 8-PSK code.

One implementation of the function R(x,y,k) includes a read-only memory (ROM). Each value of the function R(x,y,k) generally requires at least 11 bits. If M is the number of bits used to represent each value of the function R(x,y,k) in formula (8), then the size of the ROM required to store all the values of the function R(x,y,k) is equal to $3M*2^{2N}$ bits. Using a combination of ROM and logic gates, however, the function R(x,y,k) may be generated using a ROM size of only $7*2^{2N-1}$ bits, which is a factor of 0.86*M smaller or at least an order of magnitude less than previously required.

In one aspect of the present invention, a decision function generator for a Viterbi decoder includes a compressor for receiving lattice coordinates of a decoded 8-phase shift keyed code point and a bit position index and for generating arguments for a first intermediate function and a second intermediate function, an invert-sign value, and a clear-sign value; a memory coupled to the compressor for generating the first intermediate function and a second intermediate function, and a decompressor coupled to the memory for generating a value of the decision function corresponding to the lattice coordinates of the 8-phase shift keyed code point and the bit position index.

FIG. 3 illustrates a decision function generator 300 for a Viterbi decoder according to an embodiment of the present invention. Shown in FIG. 3 are a compressor logic module 302, a memory module 304, a decompressor logic module 306, an x-coordinate 308, an y-coordinate 310, a k-value 312, arguments for intermediate functions 314, intermediate functions 315, and a decision function 318 R(x,y,k).

The compressor logic module 302 receives as input the x-coordinate 308, the y-coordinate 310, and the k-value 312 arguments for the decision function 318 R(x,y,k). The memory module 304 may be, for example, two read-only memory (ROM) lookup tables that receive the arguments for intermediate functions 314 and generate the intermediate functions 316. The decompressor logic module 306 receives as input the intermediate functions 316 and generates as output the decision function 318 R(x,y,k). The compressor logic module 302 and decompressor logic module 306 substantially reduce the size of the memory required in the memory module 304 and may be implemented, for example, as described below.

A floating point number may be represented in binary form as a sign, an integer portion, and a fractional portion as shown in FIG. 4.

FIG. 4 illustrates a binary representation of a floating point number 400 for the decision function generator of FIG. 3. Shown in FIG. 4 are a sign bit 402, an integer portion 404, and a fractional portion 406.

In FIG. 4, the binary representation of a floating point number 400 has a total of $(1+M_1+M_2)$ bits. The sign bit 402 uses one bit, the integer portion 404 uses $M_1$ bits, and the fractional portion 406 uses $M_2$ bits, where $M_1$ and $M_2$ are positive integers. Accordingly, the decision function 318 R(x,y,k) may be expressed as:

$$R(x, y, k) = \begin{cases} m + n * 2^{-M_2} & \text{if sign} = 0 \\ -(m + n * 2^{-M_2}) & \text{if sign} = 1 \end{cases} \quad (10)$$

where $$m = \sum_{i=0}^{M_1-1} m_i \cdot 2^i \quad \text{and} \quad n = \sum_{i=0}^{M_2-1} n_i \cdot 2^i \quad (11)$$

FIG. 5 illustrates the 8-PSK geometrically uniform trellis modulation code of FIG. 1 with the coordinates of four symmetrically spaced demodulated code points. Shown in FIG. 5 are code points 102, 104, 106, 108, 110, 112, 114 and 116, a phase circle 118, symmetrically spaced demodulated code points A, B, C and D, a first offset x, and a second offset y. Using the lattice of FIG. 2, x-coordinates and y-coordinates of the symmetrically spaced demodulated code points A, B, C and D may be defined as:

$A(2^{N-1}+x, 2^{N-1}+y)$ $B(2^{N-1}+y, 2^{N-1}-1-x)$ $C(2^{N-1}-1-x, 2^{N-1}-1-y)$ $D(2^{N-1}-1-y, 2^{N-1}+x)$ (12)

From the symmetry of the symmetrically spaced demodulated code points A, B, C and D, the following equivalences hold:

$P^0(A)=P^5(B)=P^6(C)=P^3(D)$ $P^1(A)=P^4(B)=P^7(C)=P^2(D)$ $P^3(A)=P^0(B)=P^5(C)=P^6(D)$ $P^2(A)=P^1(B)=P^4(C)=P^7(D)$ $P^6(A)=P^3(B)=P^0(C)=P^5(D)$ $P^7(A)=P^2(B)=P^1(C)=P^4(D)$ $P^5(A)=P^6(B)=P^3(C)=P^0(D)$ $P^4(A)=P^7(B)=P^2(C)=P^1(D)$ (13)

From the equivalences (13), the following formulas for $R(x,y,k)$ may be derived:

$$\begin{cases} R(B, 0) = -R(A, 0) \\ R(B, 1) = R(A, 2) \\ R(B, 2) = -R(A, 1) \end{cases} \quad (13)$$

$$\begin{cases} R(C, 0) = R(A, 0) \\ R(C, 1) = -R(A, 1) \\ R(C, 2) = -R(A, 2) \end{cases}$$

$$\begin{cases} R(D, 0) = -R(A, 0) \\ R(D, 1) = -R(A, 2) \\ R(D, 2) = R(A, 1) \end{cases}$$

The values of $R(B,k)$, $R(C,k)$ and $R(D,k)$ may therefore be derived from $R(A,k)$.

An intermediate function for the decision function $R(x,y,k)$ may be defined as follows:

$$\overline{R}(x,y,k) = R(2^{N-1}+x, 2^{N-1}+y,k) \quad k=0,1,2 \quad 0 \leq x,y < 2^{N-1} \quad (14)$$

The intermediate function defined by formula (14) may be used to generate the decision function $R(x,y,k)$ from the following formula:

$$R(x,y,k) = (-1)^{\text{Invertsign}} \cdot \overline{R}(nx, ny, nk) \quad (15)$$

where $$nx = \begin{cases} x - 2^{N-1} & x \geq 2^{N-1}, y \geq 2^{N-1} \\ 2^{N-1} - 1 - x & \text{if} & x < 2^{N-1}, y < 2^{N-1} \\ y - 2^{N-1} & x < 2^{N-1}, y \geq 2^{N-1} \\ 2^{N-1} - 1 - y & x \geq 2^{N-1}, y < 2^{N-1} \end{cases} \quad (16)$$

$$ny = \begin{cases} y - 2^{N-1} & x \geq 2^{N-1}, y \geq 2^{N-1} \\ 2^{N-1} - 1 - y & \text{if} & x < 2^{N-1}, y < 2^{N-1} \\ x - 2^{N-1} & x \geq 2^{N-1}, y < 2^{N-1} \\ 2^{N-1} - 1 - x & x < 2^{N-1}, y \geq 2^{N-1} \end{cases} \quad (17)$$

$$nk = \begin{cases} 3-k & x \geq 2^{N-1}, y < 2^{N-1}, k=1,2 \\ 3-k & x < 2^{N-1}, y \geq 2^{N-1}, k=1,2 \\ k & \text{if} & x \geq 2^{N-1}, y \geq 2^{N-1}, k=1,2 \\ k & x < 2^{N-1}, y < 2^{N-1}, k=1,2 \\ 0 & k=0 \end{cases} \quad (18)$$

$$\text{InvertSign} = \begin{cases} 1 & x \geq 2^{N-1}, y < 2^{N-1}, k=0 \\ 1 & x < 2^{N-1}, y \geq 2^{N-1}, k=0 \\ 1 & \text{if} & x < 2^{N-1}, k=1 \\ 1 & y < 2^{N-1}, k=2 \\ 0 & \text{otherwise} \end{cases} \quad (19)$$

The intermediate function defined by formula (14) may be expressed as:

$$\overline{R}(x,y,k) = \hat{R}(x,y,k) \cdot (-1)^{\hat{S}(x,y,k)} \quad 0 \leq x,y < 2^{N-1}, \quad k=0,1,2 \quad (20)$$

where $$\hat{R}(x, y, k) = \begin{cases} \overline{R}(x, y, k) & \text{if } \overline{R}(x, y, k) \geq 0 \\ -\overline{R}(x, y, k) & \text{if } \overline{R}(x, y, k) < 0 \end{cases} \quad (22)$$

$$\hat{S}(x, y, k) = \begin{cases} 0 & \text{if } \overline{R}(x, y, k) \geq 0 \\ 1 & \text{if } \overline{R}(x, y, k) < 0 \end{cases} \quad (23)$$

From formula (4) and FIG. 5, the following relations hold for the demodulated code point A having the coordinates $(2^{N-1}+x, 2^{N-1}+y)$:

$P^0(A) \geq P^4(A), P^1(A) \geq P^5(A), P^3(A) \geq P^7(A), P^2(A) \geq P^6(A)$ (23)

therefore $\overline{R}(A, 2) \geq 0$ and $\hat{S}(x, y, 2) = 0$ for all $0 \leq x, y \leq 2_{N-1}$.

The function defined in formula (22) may be expressed as:

$$\hat{S}(x,y,k) = \tilde{S}(x,y,k) \cdot (1 - \text{ClearSign}) \quad (24)$$

where $$\tilde{S}(x,y,k) = \hat{S}(x,y,k) \text{ if } k=0, 1 \quad (25)$$

and $$ClearSign = \begin{cases} 1 & \text{if } k = 2 \\ 0 & \text{if } k = 0, 1 \end{cases} \quad (26)$$

A set of floating point numbers may be defined by:

$$\tilde{R} \in \left\{ 0, \frac{1}{4}, \frac{1}{2}, \frac{3}{4}, 1, 1\frac{1}{4}, 1\frac{1}{2}, 1\frac{3}{4}, 2, 2\frac{1}{2}, 3, 3\frac{1}{2}, 4, 5, 6, 7 \right\} \quad (27)$$

where $\tilde{R}(x, y, k) \in \tilde{R}$ is defined as the nearest number in $\tilde{R}$ to the number $\hat{R}(x, y, k)$ for each $0 \leq x, y \leq 2^{N-1}$, $k=0,1,2$. The approximation of the function $\hat{R}(x, y, k)$ by the function $\tilde{R}(x, y, k)$ is accurate enough so that the function $\hat{R}(x, y, k)$ may be replaced by the function $\tilde{R}(x, y, k)$.

The set $\tilde{R}$ contains 16 numbers, therefore four bits are needed to encode and to store in a memory block MEMORY_R the value of the function $\tilde{R}(x, y, k)$ for each $0 \leq x, y \leq 2^{N-1}$ and $k=0,1,2$. An additional bit is required to store the value of the function $\hat{S}(x, y, k)$ in a memory block MEMORY_S for each $0 \leq x, y \leq 2^{N-1}$, $k=0,1$. The memory block MEMORY_R requires a total of $(6*2^{2N-1})$ bits, and the memory block MEMORY_S requires a total of $2^{2N-1}$ bits. The values of the numbers in the set $\tilde{R}$ may be encoded as four bit numbers and generated as output in the floating point format illustrated in FIG. 4 as shown in Table 1 below.

TABLE 1

| $\tilde{R}$[3] | $\tilde{R}$[2] | $\tilde{R}$[1] | $\tilde{R}$[0] | $\tilde{R}$ | m[2] | m[1] | m[0] | n[$M_2$ − 1] | n[$M_2$ − 2] |
|---|---|---|---|---|---|---|---|---|---|
| 0 | 0 | 0 | 0 | 2.00 | 0 | 1 | 0 | 0 | 0 |
| 0 | 0 | 0 | 1 | 3.00 | 0 | 1 | 1 | 0 | 0 |
| 0 | 0 | 1 | 0 | 2.50 | 0 | 1 | 0 | 1 | 0 |
| 0 | 0 | 1 | 1 | 3.50 | 0 | 1 | 1 | 1 | 0 |
| 0 | 1 | 0 | 0 | 4.00 | 1 | 0 | 0 | 0 | 0 |
| 0 | 1 | 0 | 1 | 5.00 | 1 | 0 | 1 | 0 | 0 |
| 0 | 1 | 1 | 0 | 6.00 | 1 | 1 | 0 | 0 | 0 |
| 0 | 1 | 1 | 1 | 7.00 | 1 | 1 | 1 | 0 | 0 |
| 1 | 0 | 0 | 0 | 1.00 | 0 | 0 | 1 | 0 | 0 |
| 1 | 0 | 0 | 1 | 1.25 | 0 | 0 | 1 | 0 | 1 |
| 1 | 0 | 1 | 0 | 1.50 | 0 | 0 | 1 | 1 | 0 |
| 1 | 0 | 1 | 1 | 1.75 | 0 | 0 | 1 | 1 | 1 |
| 1 | 1 | 0 | 0 | 0.00 | 0 | 0 | 0 | 0 | 0 |
| 1 | 1 | 0 | 1 | 0.25 | 0 | 0 | 0 | 0 | 1 |
| 1 | 1 | 1 | 0 | 0.50 | 0 | 0 | 0 | 1 | 0 |
| 1 | 1 | 1 | 1 | 0.75 | 0 | 0 | 0 | 1 | 1 |

FIG. 6 illustrates a detailed block diagram of the decision function generator of FIG. 3. Shown in FIG. 6 are a compressor module 602, a memory block MEMORY_R 604, a memory block MEMORY_S 606, a decompressor module 608, an x-coordinate 308, an y-coordinate 310, a k-value 312, an nx value 610, an ny value 612, an nk[0] value 614, an nk[1] value 616, an InvertSign value 618, a ClearSign value 620, an intermediate function $\tilde{R}$ value 622, an intermediate function $\tilde{S}$ value 624, a sign value 626, an integer value 628, and a fractional value 630. The sign value 626, the integer value 628, and the fractional value 630 constitute the decision function R(x,y,k).

The compressor module 602 receives the x-coordinate 308, the y-coordinate 310, and the k-value 312 arguments of the decision function R(x,y,k) and evaluates the nx value 610, the ny value 612, the nk[0] value 614, the nk[1] value 616, the InvertSign value 618, and the ClearSign value 620 as functions of the arguments according to formulas (16)–(19) and (26).

FIG. 7 illustrates an implementation of the compressor module 602 of FIG. 6 in pseudo-Verilog language. The logic elements AND, OR, XOR, NAND, NOR, XNOR, AND01 and OR01 may be, for example, 2-input logic cells typically found in logic cell libraries typically used in the design of application-specific integrated circuits (ASICs), where AND01(x, y)=¬x ∧ y and OR01=¬x ∨ y.

The maximum number of cells that lie on the path from an input of a logic module to an output of the logic module is referred to as the depth of the logic module. The implementation of the compressor module 602 in FIG. 7 has a depth of three and contains (6N+2) cells.

The memory block MEMORY_R 604 and the memory block MEMORY_S 606 receive the nx value 610, the ny value 612, the nk[0] value 614, and the nk[1] value 616 and retrieve the stored values 622 and 624 of the intermediate functions $\tilde{R}$ and $\tilde{S}$ according to formulas (25) and (27).

The decompressor module 608 receives the intermediate function $\tilde{R}$ value 622, the intermediate function $\tilde{S}$ value 624, the InvertSign value 618, and the ClearSign value 620 and generates the sign value 626, the integer value 628, and the fractional value 630 that constitute the decision function R(x,y,k). The sign value 626 is generated as XOR(AND01(ClearSign, $\tilde{S}$), InvertSign). The integer value 628 and the fractional value 630 are generated as illustrated in Table 1 above.

FIG. 8 illustrates an implementation of the decompressor module 608 of FIG. 6 in pseudo-Verilog language. The implementation of the decompressor module 608 in FIG. 8 has a depth of two and contains 10 cells.

FIG. 9 illustrates a flow chart for a method of generating a decision function for a Viterbi decoder according to an embodiment of the present invention.

Step 902 is the entry point of the flow chart 700.

In step 904, an x-coordinate, a y-coordinate, and a k-value are received as the arguments of the decision function R(x,y,k) as shown in FIG. 6.

In step 906, an nx value 610, an ny value 612, an nk[0] value 614, an nk[1] value 616, an InvertSign value, and a ClearSign value are generated according to formulas (16), (17), (18), (19) and (26) from the arguments of the decision function received in step 904.

In step 908, the intermediate functions $\tilde{R}$ and $\tilde{S}$ are evaluated according to formulas (25) and (27).

In step 910, a sign value, an integer value, and a fractional value constituting the value of the decision function R(x,y,k) are generated as output from the intermediate functions $\tilde{R}$ and $\tilde{S}$.

Step 912 is the exit point of the flow chart 900.

Although the method of the present invention is illustrated with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. A decision function generator for a Viterbi decoder comprising:
    a compressor module for receiving arguments of a decision function and for evaluating functions of the arguments of the decision function;
    a memory module coupled to the compressor module for generating an intermediate function from the functions of the arguments; and
    a decompressor module coupled to the memory module for generating a sign value, an integer value, and a fractional value constituting a value of the decision function from the intermediate function.

2. The decision function generator of claim 1 wherein the arguments of the decision function include lattice coordinates of an 8-phase shift keyed code point and a code point bit position index.

3. The decision function generator of claim 1 wherein the functions of the arguments include an nx value, an ny value, an nk value, an InvertSign value, and a ClearSign value.

4. The decision function generator of claim 1 wherein the intermediate function comprises a set of numbers approximating the value of the decision function for possible arguments of the decision function.

5. The decision function generator of claim 1 wherein the compressor module has a logical depth of no more than three.

6. The decision function generator of claim 1 wherein the decompressor module has a logical depth of no more than two.

7. A method of generating a decision function for a Viterbi decoder comprising steps for:
    receiving arguments of a decision function;
    generating functions of the arguments of the decision function;
    evaluating an intermediate function from the functions of each of the arguments; and
    generating as output a sign value, an integer value, and a fractional value constituting a value of the decision function from the intermediate function.

8. The method of claim 7 wherein the arguments of the decision function are an x-coordinate, a y-coordinate, and a k-value.

9. The method of claim 7 wherein the functions of the arguments are an nx value, an ny value, an nk value, an InvertSign value, and a ClearSign value.

10. The method of claim 7 wherein the sign value is a function of the InvertSign value and the ClearSign value.

11. The method of claim 7 wherein the integer value has a width of $M_1$ bits and wherein $M_1$ is a positive integer.

12. The method of claim 11 wherein $M_1$ is equal to three.

13. The method of claim 7 wherein the fractional value has a width of $M_2$ bits and wherein $M_2$ is a positive integer.

14. The method of claim 13 wherein the fractional value has a width of $M_2$ bits and wherein $M_2$ is equal to two.

15. The method of claim 7 wherein the intermediate function comprises a set of numbers approximating the value of the decision function for possible arguments of the decision function.

16. A method of generating a decision function for a Viterbi decoder comprising steps for:
    receiving an x-coordinate, a y-coordinate, and a k-value as arguments of a decision function R(x,y,k);
    generating an nx value, an ny value, an nk value, an InvertSign value, and a ClearSign value from the arguments of the decision function R(x,y,k);
    evaluating intermediate functions $\tilde{R}$ and $\tilde{S}$ from the nx value, the ny value, the nk value; and
    generating as output a sign value, an integer value, and a fractional value constituting the value of the decision function R(x,y,k) from the intermediate functions $\tilde{R}$ and $\tilde{S}$.

17. The method of claim 16 wherein the intermediate function $\tilde{R}$ is a set of numbers approximating the value of the decision function R(x,y,k) for possible arguments of the decision function.

18. The method of claim 16 wherein the intermediate function $\tilde{S}$ is a function of the InvertSign value and the ClearSign value.

* * * * *